US006975144B2

(12) United States Patent  
Gauthier et al.

(10) Patent No.: US 6,975,144 B2  
(45) Date of Patent: Dec. 13, 2005

(54) SYSTEM, METHOD AND APPARATUS FOR IMPROVING SENSE AMPLIFIER PERFORMANCE CHARACTERISTICS USING PROCESS FEEDBACK

(75) Inventors: Claude R. Gauthier, Cupertino, CA (US); Aninda K. Roy, San Jose, CA (US); Brian W. Amick, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/367,340

(22) Filed: Feb. 13, 2003

(65) Prior Publication Data

US 2004/0160243 A1    Aug. 19, 2004

(51) Int. Cl.[7] .............................................. H03F 3/45
(52) U.S. Cl. ....................... 327/51; 327/52; 327/534
(58) Field of Search ........................... 327/51, 52, 534, 327/535; 330/254, 252, 253, 256, 259, 352; 365/207, 208

(56) References Cited

U.S. PATENT DOCUMENTS

| 3,683,371 | A | * | 8/1972 | Holz ............................. 341/32 |
| 5,351,000 | A | | 9/1994 | Farwell ...................... 324/76.77 |
| 5,508,570 | A | * | 4/1996 | Laber et al. .................. 327/563 |
| 5,787,092 | A | | 7/1998 | Jaynes et al. .................. 37/22.1 |
| 6,011,437 | A | * | 1/2000 | Sutardja et al. .............. 330/254 |
| 6,127,890 | A | * | 10/2000 | Shimomura et al. ......... 330/254 |
| 6,215,989 | B1 | * | 4/2001 | Otaka ........................ 455/234.1 |
| 6,563,180 | B2 | * | 5/2003 | Ishibashi et al. ............. 257/391 |
| 6,763,266 | B1 | * | 7/2004 | Kroll ............................... 607/7 |
| 6,798,286 | B2 | * | 9/2004 | Dauphinee et al. .......... 330/129 |
| 2002/0021158 | A1 | | 2/2002 | Mullarkey .................... 327/277 |
| 2002/0026610 | A1 | | 2/2002 | Merritt ........................ 714/724 |

OTHER PUBLICATIONS

Josep Altet, Antonio Rubio, Hideo Tamamoto, "Analysis of the Feasibility of Dynamic Thermal Testing in Digital Circuits", *IEEE*, 1997, pp. 149-154.

European Search Report dated Aug. 26, 2004.

\* cited by examiner

*Primary Examiner*—Tuan T. Lam  
*Assistant Examiner*—Hiep Nguyen  
(74) *Attorney, Agent, or Firm*—Martine Penilla & Gencarella, LLP

(57) ABSTRACT

A system and method of adjusting a sense amplifier to compensate for the process-type of the sense amplifier includes determining a process-type of the sense amplifier. An amplification control parameter is provided to the sense amplifier. The amplification control parameter is adjusted to adjust the sense amplifier according to the process-type of the sense amplifier.

20 Claims, 12 Drawing Sheets

SYSTEM, METHOD AND APPARATUS FOR IMPROVING SENSE AMPLIFIER PERFORMANCE CHARACTERISTICS USING PROCESS FEEDBACK

BACKGROUND OF THE INVENTION

1. Field of the Invention

The present invention relates generally to sense amplifiers, and more particularly, to methods and systems for optimizing sense amplifier performance for the sense amplifier manufacturing process.

2. Description of the Related Art

The manufacturing processes for manufacturing semiconductor devices include multiple steps, multiple sub-processes and countless opportunities for unintended variation. The semiconductor manufacturing processes are constantly refined to produce semiconductors having a desired performance level such as a device switching speed. The semiconductor manufacturing processes are also very strictly controlled to yield repeatable results. However, manufacturing process variations still do occur. Therefore, the performance levels of the resulting semiconductor devices can vary somewhat. These performance variations are typically measured in production testing.

By way of example, a refined and controlled semiconductor manufacturing process produces sense amplifiers having a range of switching speeds. FIG. 1A is a graph 100 of a distribution of switching speeds of sense amplifiers produced by a selected semiconductor manufacturing process. A first portion 102 of the sense amplifiers has a switching time within a desired target range such as between 1.00 nanoseconds (ns) and 0.95 ns. As a result, all of the sense amplifiers in the first portion 102 can be operated in a 1-gigahertz (gHz) circuit because a 1 GHz circuit requires the sense amplifier to have a switching speed of 1.00 ns or less. The first portion 102 of sense amplifiers are referred to as being "typical-type" sense amplifiers because the first portion 102 of sense amplifiers operates within the desired target range (e.g., at least 1 gHz) of switching speed.

A second portion 104 of the sense amplifiers has a faster switching time of less than 0.95 ns (e.g., between 0.90 ns to 0.95 ns). As a result, all of the sense amplifiers in the second portion 104 can also be operated in a 1 GHz circuit. The second portion 104 of sense amplifiers are referred to as being "fast-type" sense amplifiers because the second portion 104 of sense amplifiers can operate faster than the desired target range (e.g., at least 1 gHz).

However, a third portion 106 of the sense amplifiers has a switching speed of more than 1.00 ns (e.g. between 1.00 ns and 1.05 ns). Therefore the all of the sense amplifiers in the third portion 106 cannot be operated in a 1 GHz circuit. If the desired performance of the third portion 106 of the sense amplifiers were to switch at a frequency of 1 GHz for use in a 1 GHz circuit, then the third portion 106 of the sense amplifiers would be unsuitable for the desired use. The third portion 106 of sense amplifiers are referred to as being "slow-type" sense amplifiers because the third portion 106 of sense amplifiers cannot operate at the desired target range (e.g., at least 1 gHz).

As described in FIG. 1A above, the semiconductor manufacturing process produces semiconductors operating across a performance range due to variations in the semiconductor manufacturing processes. The performance range can occur between sense amplifiers that are formed on different semiconductor wafers or sense amplifiers that are formed on different parts of a single wafer or even sense amplifiers contained in different parts of a single integrated circuit. By way of example, in a single manufacturing process, a first sense amplifier formed on a first semiconductor wafer may be about 20 percent faster than a second sense amplifier formed on a second semiconductor wafer. Similarly, a first sense amplifier formed on a first portion of a semiconductor wafer may be about 5 percent faster than a second sense amplifier formed on a second portion of the same semiconductor wafer. Typically sense amplifiers and other semiconductor components are tested during the production process to determine if the component has a fast, slow or typical operating (e.g., switching) speed.

Unfortunately, the slow-type sense amplifiers 106 are often intermixed with the typical-type sense amplifiers 102 and the fast-type sense amplifiers 104. For example, FIG. 1B shows a microprocessor 120 with four signal paths 122, 124, 126 and 128 between respective regions A and B, A and C, A and D, and A and D. FIG. 1C is a schematic of the signal path 124. The signal path 124 includes a flip-flop 142 coupled through multiple logic stages 144, 146, 148 to a sense amplifier 150. If the sense amplifier 150 is a slow-type sense amplifier, then the signal path 124 will be a slow-type signal path. Further, if signal path 122 is a fast-type signal path (e.g., includes fast-type components) and signal paths 126 and 128 are typical-type signal paths (e.g., include typical-type components) then the timing of the entire integrated circuit 120 is limited to no faster than the slow-type signal path 124. Therefore the entire integrated circuit 120 is a slow-type integrated circuit.

FIG. 2 is a schematic of a well-known sense amplifier 150. The sense amplifier 200 is a well-known differential-type amplifier that is capable of resolving small voltage differences and producing a large output voltage. The sense amplifier 150 includes four transistors 202, 204, 206, 208.

The performance of the sense amplifier 150 is controlled by several amplification control parameters such as bias voltage and bias current. Transistor 212 provides a constant current source that is controlled by a bias voltage applied to the gate of transistor 212. As shown transistor 212 is an n-type device so therefore the bias voltage is an N-bias. The bias voltage is typically supplied by a bias voltage source that is local to the particular sense amplifier 150 or a set of sense amplifiers. The bias voltage is a nominal constant voltage from the bias voltage source. The actual bias voltage required is dependant on the particular device. In one semiconductor device, the bias voltage is typically 0.5VDC. The bias voltage biases transistor 212 at saturation so as to conduct a constant current $I_{BIAS}$.

Constant current $I_{BIAS}$ is equal to the sum of $I_1$ and $I_2$ flowing across transistors 204 and 208, respectively. While the sum of $I_1$ and $I_2$ is constant, current $I_1$ is greater than $I_2$ if the voltage is applied to the gate of transistor 204 is greater than the voltage applied to the gate of transistor 208. Conversely, current $I_2$ is greater than $I_1$ if the voltage is applied to the gate of transistor 208 is greater than the voltage applied to the gate of transistor 204. An output signal is taken from output terminal 210.

The gain ($A_v$) of the sense amplifier 150 is equal to the product of resistance ($R_L$) of the load transistors 202, 206 and the trans-conductance (gm) of the input transistors 204, 208. The slew rate (i.e., switching time) of the sense amplifier 150 is dependant on the ratio of the $I_{BIAS}$ and the output capacitance ($C_o$). Therefore, a changing in the bias current $I_{BIAS}$ can change the slew rate (i.e., increase or decrease the switching time) and the gain ($A_v$) of the sense amplifier 150. Similarly, a change in the bias voltage can change the bias current $I_{BIAS}$.

In the past, increasing a power supply voltage ($V_{DD}$) could accelerate a slow-type integrated circuit such as integrated circuit 120, by increasing the bias voltage to the slow-type sense amplifier 150. Increasing the $V_{DD}$ can similarly also cause all of the components in the slow-type integrated circuit 120 to switch faster.

The power P that must be dissipated by the integrated circuit 120 can be determined as shown in the following Formula 1:

$$P=C*(V_{DD})^2*F \quad \text{Formula 1}$$

Where C is the capacitance of the integrated circuit 120 and F is the frequency of operation. Therefore as $V_{DD}$ is increased then the power dissipation is also increased at an exponential rate.

In many prior art integrated circuits an increased power dissipation was easily managed with improved cooling (e.g., larger heat sinks, cooling fans, etc.). Unfortunately, many current integrated circuits include device densities and devices having physical sizes that cannot tolerate increased power dissipation throughout the integrated circuit. As a result, increasing the $V_{DD}$ will reduce the reliability of the integrated circuit. Simply increasing the $V_{DD}$ to the entire integrated circuit is therefore not an acceptable option.

In view of the foregoing, there is a need for a system and method for increasing the operational speed of the slow-type components such as slow-type sense amplifiers in an integrated circuit without significantly increasing the amount of power that must be dissipated by the integrated circuit and thereby not reducing the reliability of the integrated circuit.

SUMMARY OF THE INVENTION

Broadly speaking, the present invention fills these needs by providing a system and method for optimizing sense amplifier performance for the process-type of the sense amplifier. It should be appreciated that the present invention can be implemented in numerous ways, including as a process, an apparatus, a system, computer readable media, or a device. Several inventive embodiments of the present invention are described below.

On embodiment includes a method of adjusting a sense amplifier to compensate for the process-type of the sense amplifier includes determining a process-type of the sense amplifier. An amplification control parameter is provided to the sense amplifier. The amplification control parameter is adjusted to adjust the sense amplifier according to the process-type of the sense amplifier.

The amplification control parameter can include a bias voltage. The bias voltage can be provided by an adjustable bias voltage source.

A process monitor can receive the process-type of the sense amplifier. Adjusting the amplification control parameter to the sense amplifier according to the process-type of the sense amplifier can include determining a process-type correction signal, and applying the process-type correction signal to the adjustable bias source.

Determining the process-type correction signal can include providing a look-up table that includes a first process-type and a second process-type. A first process-type correction signal that corresponds to the first process-type and a second process-type correction signal that corresponds to the second process-type are also included in the look-up table.

Determining the process-type correction signal can include providing a look-up table that includes at least two process-types and a corresponding process-type correction signal for each of the least two process-types.

Applying the process-type correction signal to the adjustable bias source can include outputting an n-bit process-type correction signal from the process monitor and receiving the n-bit process-type correction signal in the adjustable bias source. The n-bit process-type correction signal can include an I/O buffer control signal.

Adjusting the bias voltage to the sense amplifier according to the process-type of the sense amplifier can include converting the n-bit process-type correction signal in the adjustable bias source to an adjust voltage. The adjust voltage can be added to a constant voltage to produce an adjusted bias voltage.

The amplification control parameter can include a bias current.

Another embodiment can include an integrated circuit can include multiple sense amplifiers. The sense amplifiers can be distributed about the integrated circuit, each one of the sense amplifiers including a control input. The integrated circuit can also include a process monitor capable of determining a corresponding process-type that correspond to each of the sense amplifiers. The process monitor also has an output coupled to the control input of each one of the corresponding sense amplifiers.

The process monitor can include a processor and a processor readable storage medium. The processor includes a control output signal that is coupled to the control input of each of the corresponding sense amplifiers. The processor readable storage medium includes the process-types that correspond to each of the sense amplifiers stored therein.

The processor can be external to the integrated circuit. The process monitor is capable of outputting a digital control input signal to the control input of each of the least one corresponding sense amplifiers.

Each one of the sense amplifiers can include an adjustable current source, each one of the adjustable current sources having a bias input. Each one of the sense amplifiers can also include an adjustable bias source that has an output coupled to the corresponding bias input. Each of the corresponding, adjustable bias sources can have a bias control input coupled to the sense amplifier control input.

The bias input can determine a current flow through the current source.

Each of the corresponding, adjustable bias sources can include a constant voltage circuit and a voltage adjuster. An output of the constant voltage circuit and an output of the voltage adjuster can be coupled to the adjustable bias source output.

The constant voltage circuit can includes a voltage divider. The voltage adjuster can include a digital to analog converter.

The voltage adjuster is capable of receiving a digital process-type control signal from the process monitor and outputting an adjusting voltage. An adjustable bias source output voltage can equal a sum of the output voltage of the constant voltage circuit and the adjusting voltage.

Another embodiment includes a microprocessor that includes multiple sense amplifiers that are distributed about the microprocessor. Each one of the sense amplifiers can include an adjustable current source. Each one of the adjustable current sources having a bias input. Each of the sense amplifiers including a corresponding, adjustable bias source that has an output coupled to the corresponding bias input. Each of the corresponding, adjustable bias sources having a control input. The microprocessor also includes a process monitor capable of determining a process-type that corresponds to each of the sense amplifiers and having an output coupled to the control input of the corresponding sense amplifiers.

One aspect of the present invention provides the ability to selectively and individually adjust the performance of the sense amplifiers and other devices according to the process-type (e.g., fast, slow or typical operating speeds) of the sense amplifiers and other devices. This allows the sense amplifiers to be selectively accelerated or slowed so as to minimize any increase in power consumption and dissipation. As a result, a larger portion of the semiconductor device production throughput can be used to meet a desired target performance without impacting the reliability of the semiconductor devices.

In at least one embodiment, the present invention advantageously allows a switching time of a slow-type sense amplifier to be reliably accelerated to a switching time of a typical-type sense amplifier or even a fast-type sense amplifier. In this manner, the slow-type sense amplifier can be utilized in typical-type and fast-type circuits. Thereby, the slow-type sense amplifier can still be used rather than discarded.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Several exemplary embodiments for dynamically optimizing sense amplifier performance for the process-type of the sense amplifier will now be described. In at least one embodiment, the present invention allows a switching time of a slow-type sense amplifier to be reliably accelerated to a switching time of a typical-type sense amplifier or even a fast-type sense amplifier. Accelerating a slow-type sense amplifier reduces manufacturing waste by allowing the slow-type integrated circuit to still be used as typical-type integrated circuits. It will be apparent to those skilled in the art that the present invention may be practiced without some or all of the specific details set forth herein.

Figure 1A:
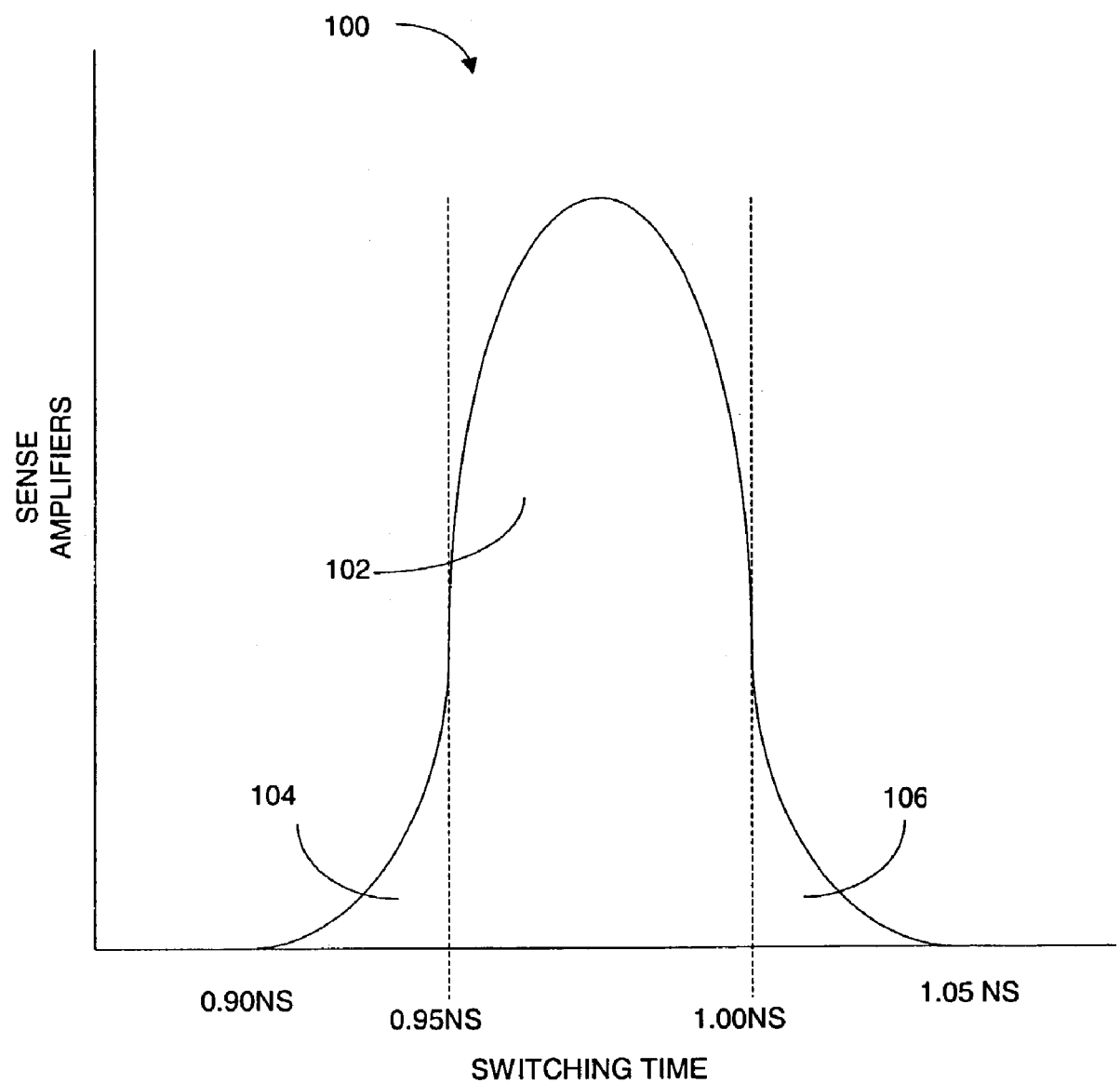
FIG. 1A is a graph of a distribution of switching speeds of sense amplifiers produced by a selected semiconductor manufacturing process.
Figure 1B:
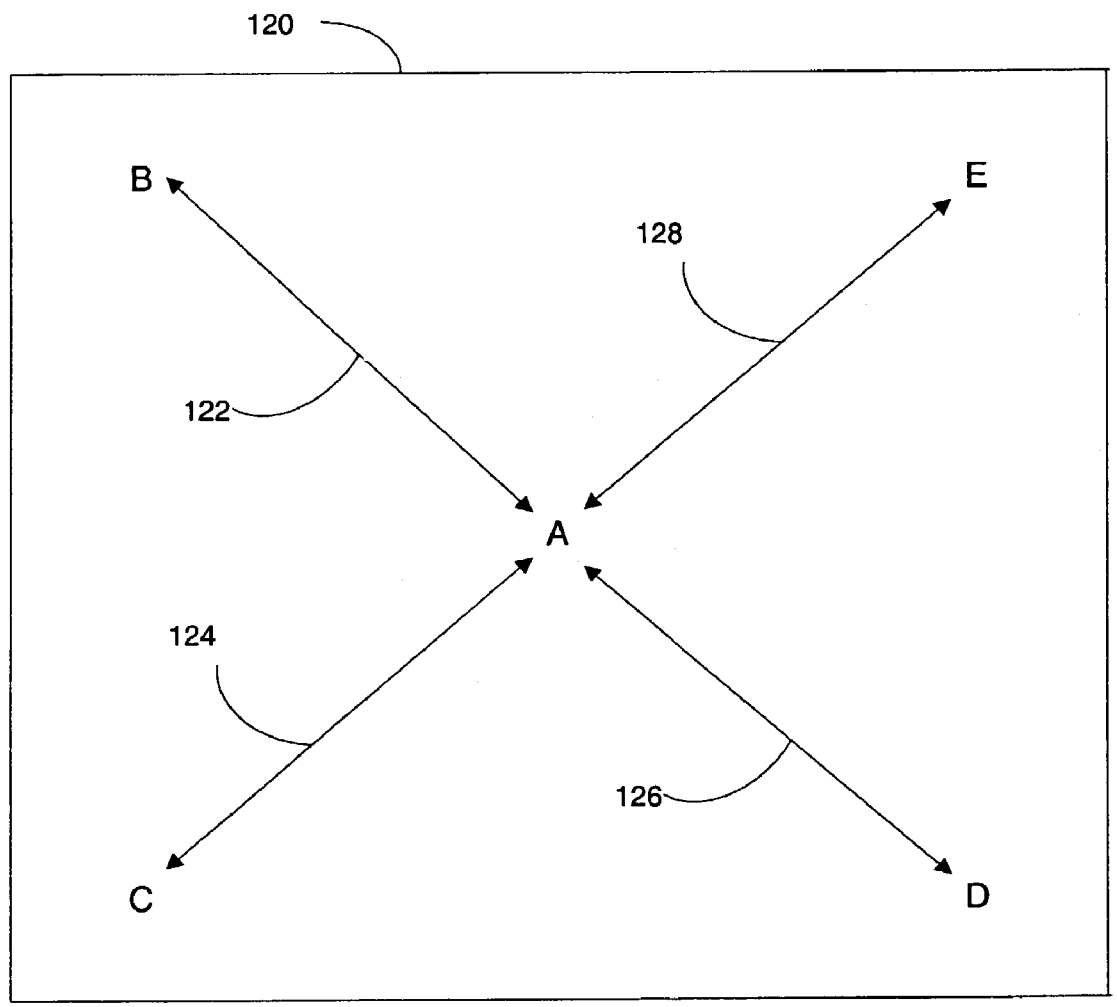
FIG. 1B shows a microprocessor with four signal paths between respective regions of the microprocessor.
Figure 1C:
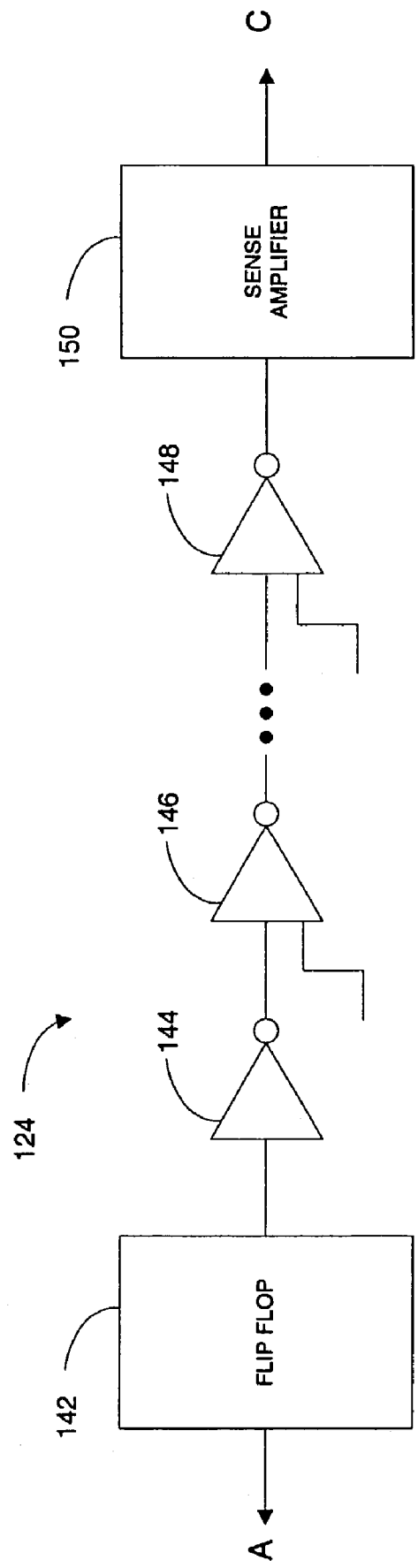
FIG. 1C is a schematic of a signal path.
Figure 2:
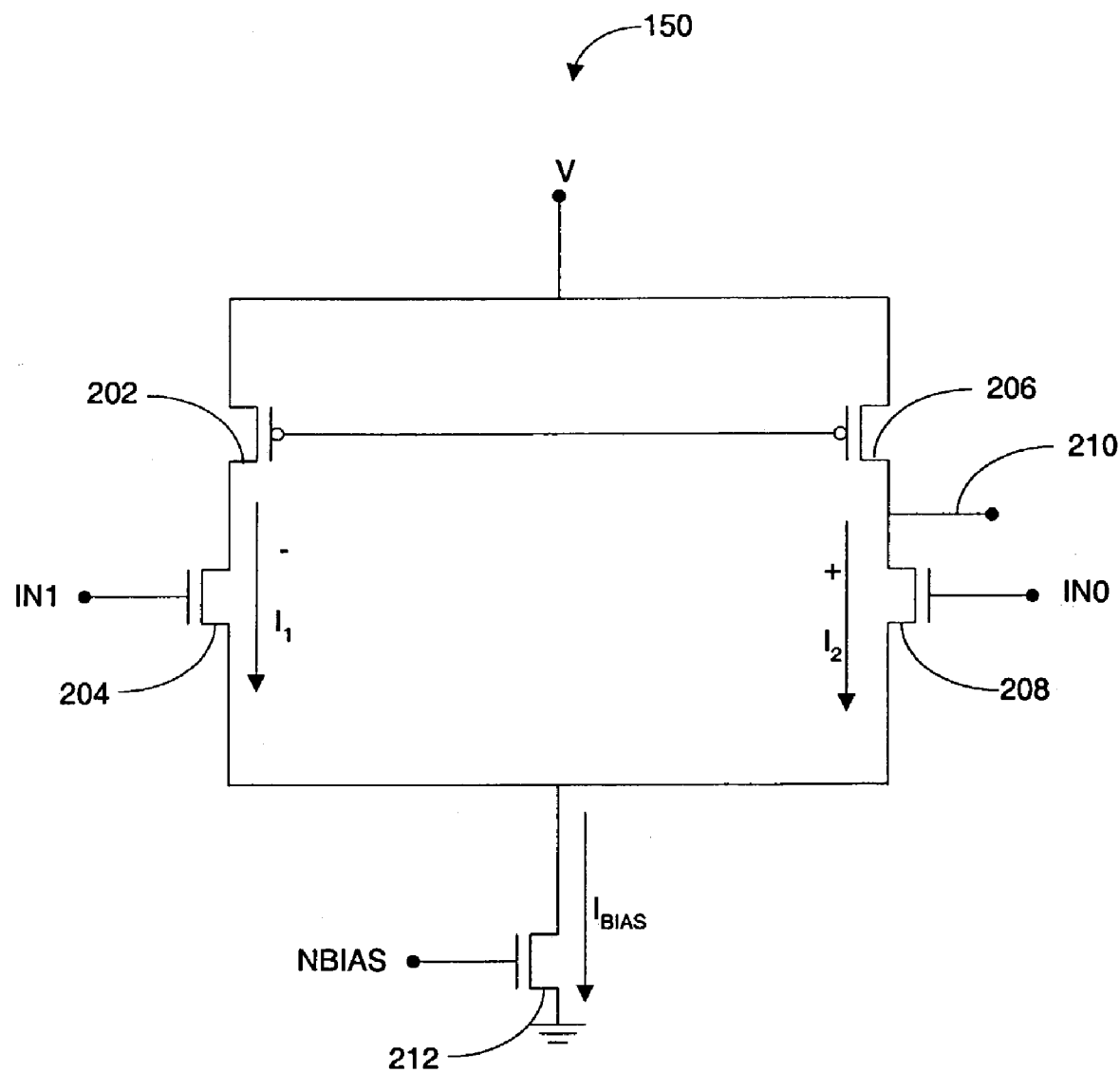
FIG. 2 is a schematic of a well-known sense amplifier.
Figure 3A:
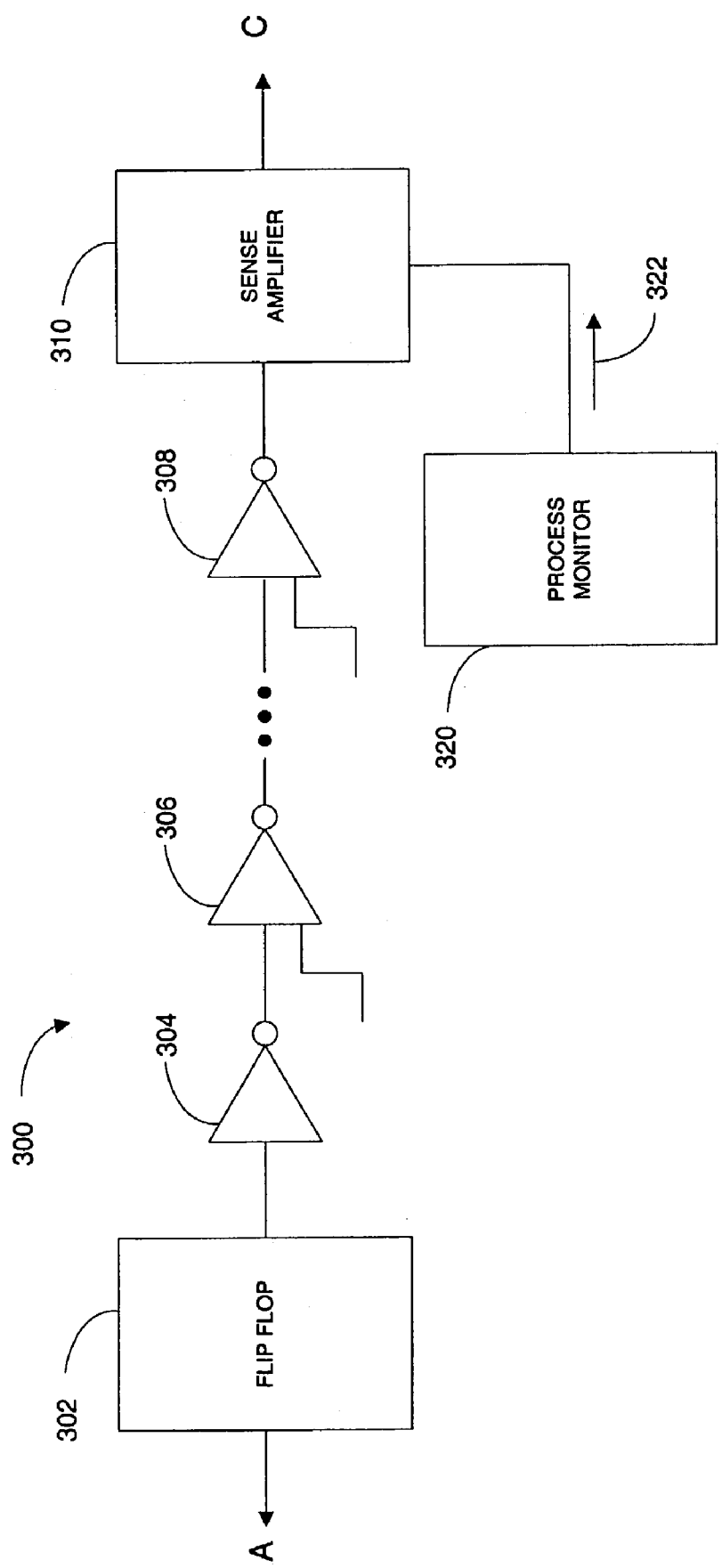
FIG. 3A is a block diagram of an improved signal path in accordance with one embodiment of the present invention.

FIG. 3A is a block diagram of an improved signal path 300 in accordance with one embodiment of the present invention. The signal path 300 includes a flip-flop 302 coupled through multiple logic stages 304, 306, 308 to a sense amplifier 310. If the sense amplifier 310 is a slow-type sense amplifier, then the signal path 300 will be a slow-type signal path. The signal path 300 also includes a process monitor 320 coupled to the sense amplifier 310. The process monitor 320 can control various control parameters of the sense amplifier 310 SO as to cause the slow-type sense amplifier 310 to switch faster (i.e., increase the slew rate). In one embodiment, the process monitor 320 can control (e.g., increase) the bias voltage of the individual sense amplifier 310 to cause the slow-type sense amplifier 310 to switch faster.

Figure 3B:
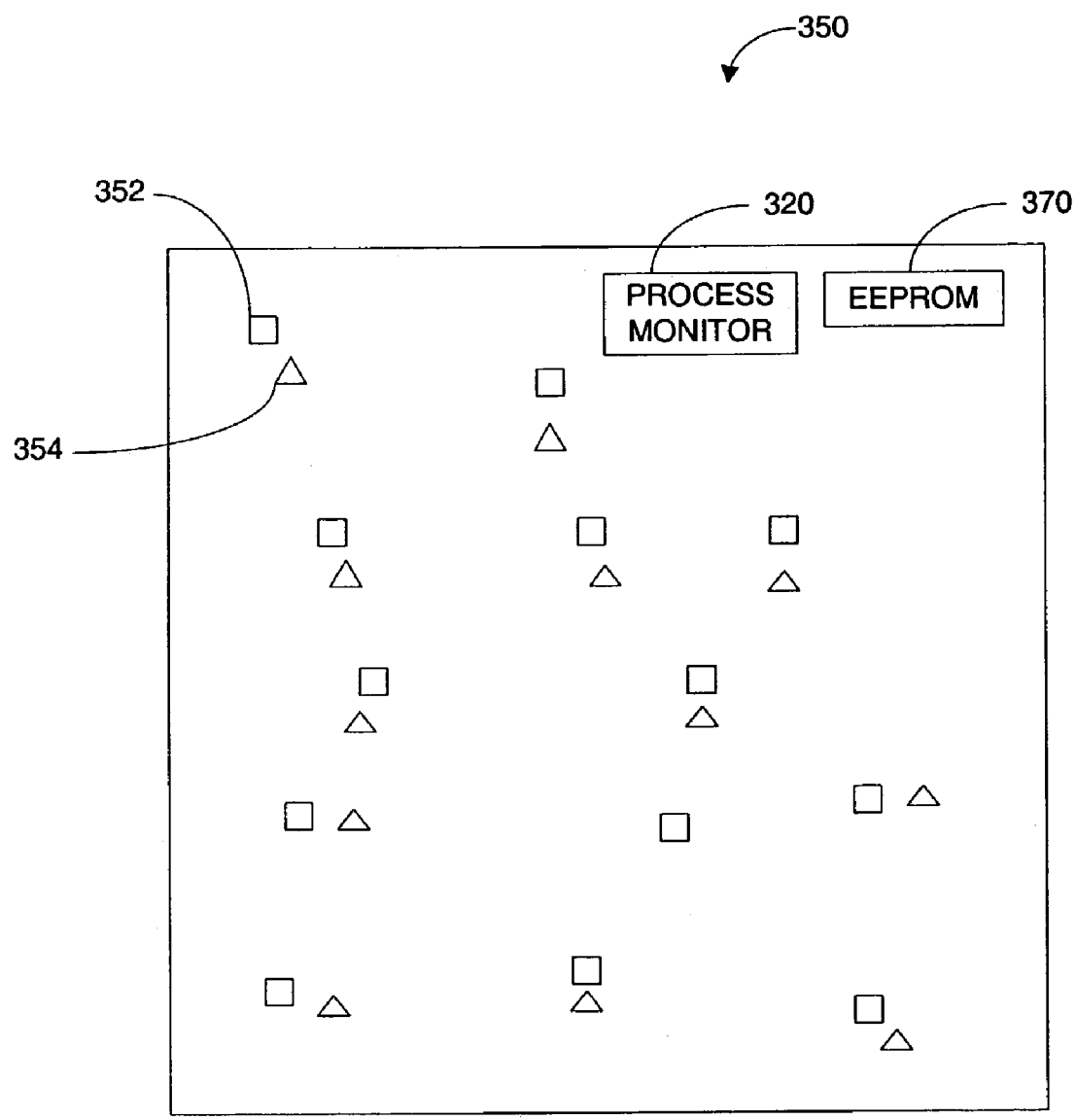
FIG. 3B shows a block diagram of an IC die that includes a process monitoring system, according to one embodiment of the present invention.

FIG. 3B shows a block diagram of an IC die 350 that includes a process monitoring system, according to one embodiment of the present invention. Multiple bias voltage sources 352 are represented by multiple small squares that are distributed around the IC die 350. The multiple bias voltage sources 352 are distributed around the IC die 350 SO as to be local to various sense amplifiers 354 (or sets of sense amplifiers) that are also distributed around the IC die 350. The multiple sense amplifiers are represented by triangles.

The process monitoring system includes a process monitor or processor or controller 320. The process monitor 320 can be a specially designed portion of the IC die 350 or maybe included in another functional portion of the IC die 350. By way of example, if the IC die 350 is a microprocessor, the processing portion of the process monitor 320 may be included in the main processing core of the microprocessor. In an alternative embodiment, the process monitor 320 can be external to the IC die 350 such as in a peripheral IC or even an IC remotely coupled to the IC die 350 by a communications network such as a computer network. The IC die 350 can also include multiple process monitors. The multiple process monitors can be distributed around. Each of the multiple process monitors can be coupled to separate portions of the devices in the IC 350.

The process monitor 320 can determine the process-type of various devices in the IC 350. By way of example, the process monitor 320 can monitor dynamic testing such as switching speed comparisons to determine a switching speed of a particular device and thereby identify the process-type of the device under test. Alternatively, the process monitor 320 can retrieve stored process-type information for each device. The stored process-type information can be stored on the IC 350 such as in an EEPROM 370 or in a storage location off the IC 350.

Figure 4:
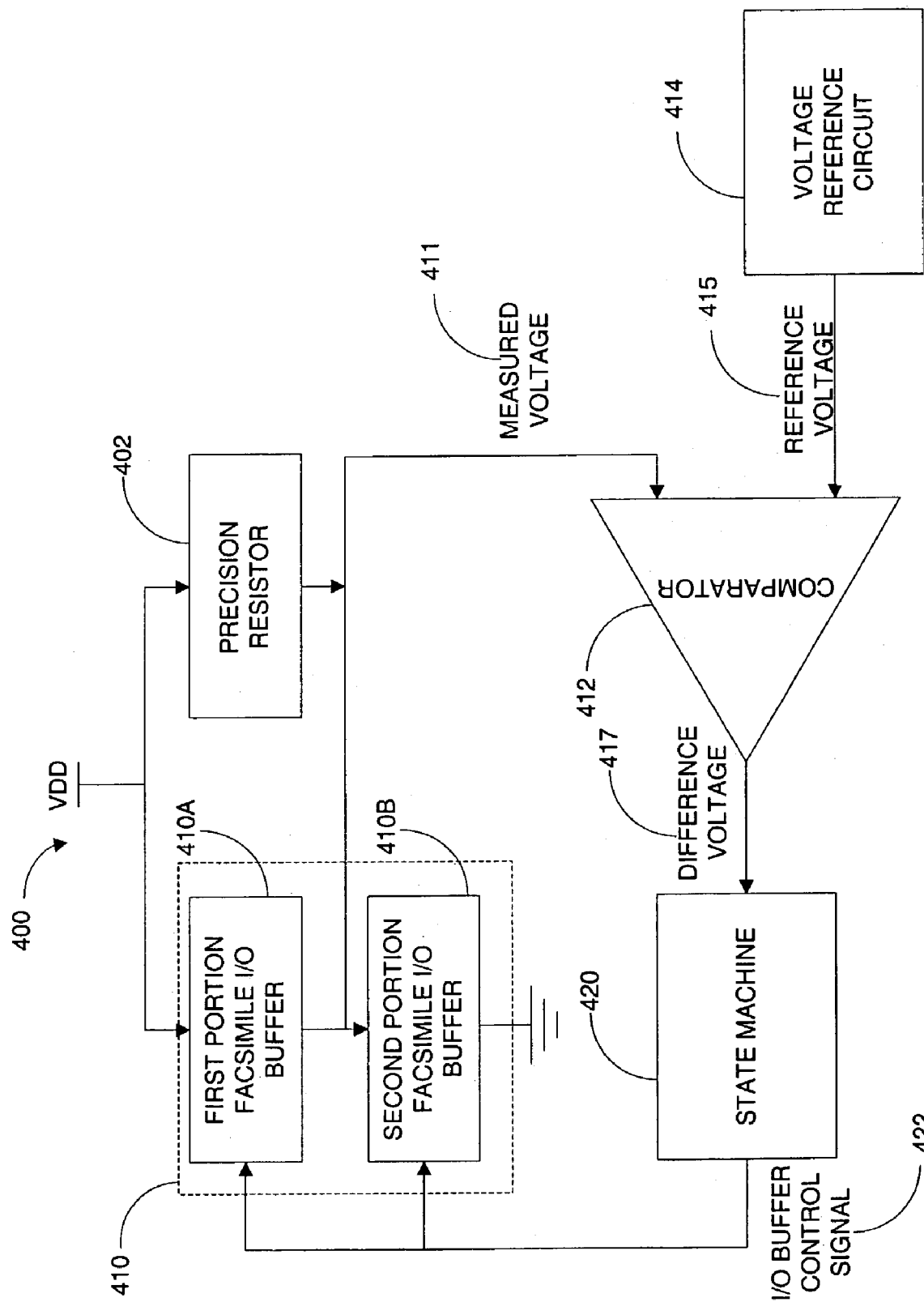
FIG. 4 shows an I/O buffer system in accordance with one embodiment of the present invention.

FIG. 4 shows an I/O buffer system 400 in accordance with one embodiment of the present invention. The I/O buffer system 400 can be used to adjust the impedance of the I/O data buffers for an IC as will be described in more detail below. The I/O buffer system includes a precision resistor 402 coupled in parallel with a first portion of a facsimile I/O buffer 410A. A supply voltage VDD is applied to both the precision resistor 402 and the first portion of a facsimile I/O buffer 410A. A second portion of the facsimile I/O buffer 410B is coupled in series with the first portion of a facsimile I/O buffer 410A. The second portion of the facsimile I/O buffer 410B is also coupled to ground. The precision resistor 402, the first portion of the facsimile I/O buffer 410A and the second portion of the facsimile I/O buffer 410B form a voltage divider circuit.

A measured voltage 411 that is output from the voltage divider circuit is applied to a first input of a comparator 412. A second input to the comparator is coupled to a reference voltage source 414. The comparator 4120 compares the measured voltage 411 to a reference voltage 415 and outputs a difference voltage 417. To a state machine 420. The state machine 420 produces an I/O buffer control signal 422 and applies the I/O buffer control signal 422 to the first portion of the facsimile I/O buffer 410A and the second portion of the facsimile I/O buffer 410B.

Each of the first portion of the facsimile I/O buffer 410A and the second portion of the facsimile I/O buffer 410B include multiple impedance legs coupled in parallel. The I/O buffer control signal 422 can enable and disable (e.g., bias) impedance legs in the first portion of the facsimile I/O buffer 410A and the second portion of the facsimile I/O buffer 410B so as to adjust the measured voltage 411 until the difference voltage 417 is equal to zero. The I/O buffer control signal 422 is a control signal to adjust the impedance of the facsimile I/O buffer 410 according to the conditions of the facsimile I/O buffer 410.

Impedance in facsimile I/O buffer 410 can vary due to the manufacturing processes as described in the Background section above. By way of example, a "slow-type" I/O buffer circuit can have greater impedance than a "typical-type" I/O buffer circuit and the "typical-type" I/O buffer circuit can have greater impedance than a "fast-type" I/O buffer circuit.

Figure 5:
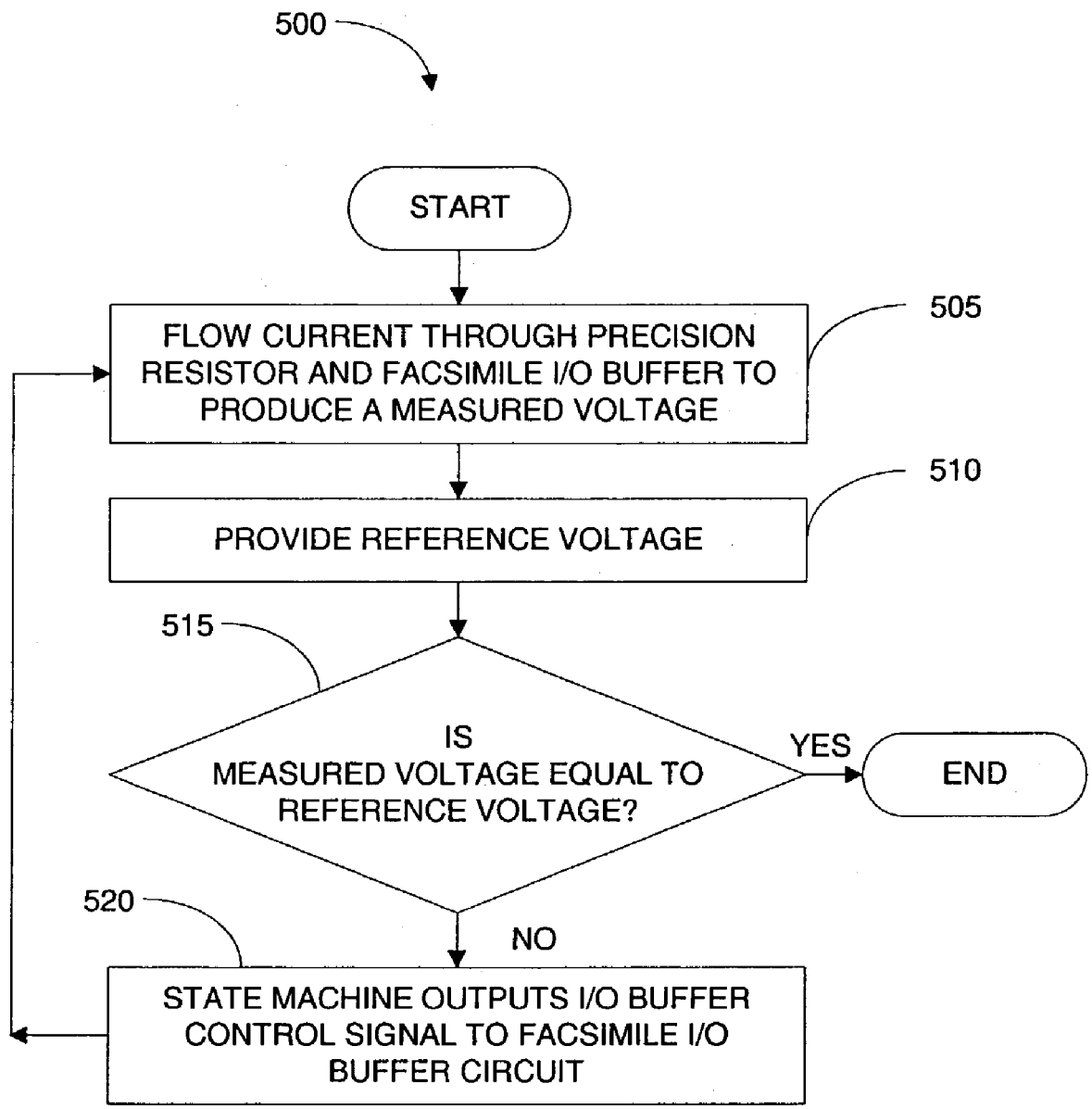
FIG. 5 is a flowchart of the method operations of the I/O buffer system in accordance with one embodiment of the present invention.

FIG. 5 is a flowchart 500 of the method operations of the I/O buffer system 400 in accordance with one embodiment of the present invention. In an operation 505, a supply voltage ($V_{DD}$) is applied to the precision resistor 402 and the first portion of the facsimile I/O buffer 410A to cause a current to flow and produce a measured voltage 411 across the second portion of the facsimile I/O buffer 410B. In an operation 510, a reference voltage 415 is supplied from a voltage reference circuit 414.

In an operation 515, the measured voltage 411 and the reference voltage 415 are compared in the comparator 412. If the measured voltage 411 and the reference voltage 415 are equal then no adjustments are required and the method operations can end. Alternatively, the method operations 500 can be continuous, in which case, the method operations continue in operation 505.

If however, in operation 515, the measured voltage 411 and the reference voltage 415 are not equal, then the state machine 420 outputs an I/O buffer control signal 422 to I/O buffer circuit 410. The I/O buffer control signal 422 can enable or disable one or more impedance legs of the I/O buffer circuit 410. The method operations then continue in operation 505. By way of example, if the I/O buffer 410 is a slow-type I/O buffer and four legs are enabled, then the I/O buffer control signal 422 can enable an additional impedance leg to reduce the impedance of the facsimile I/O buffer 410. In one embodiment, the state machine 420 is used as the process monitor and the I/O buffer control signal 422 is used to adjust a sense amplifier so as to correct for the process-type of the sense amplifier.

Figure 6A:
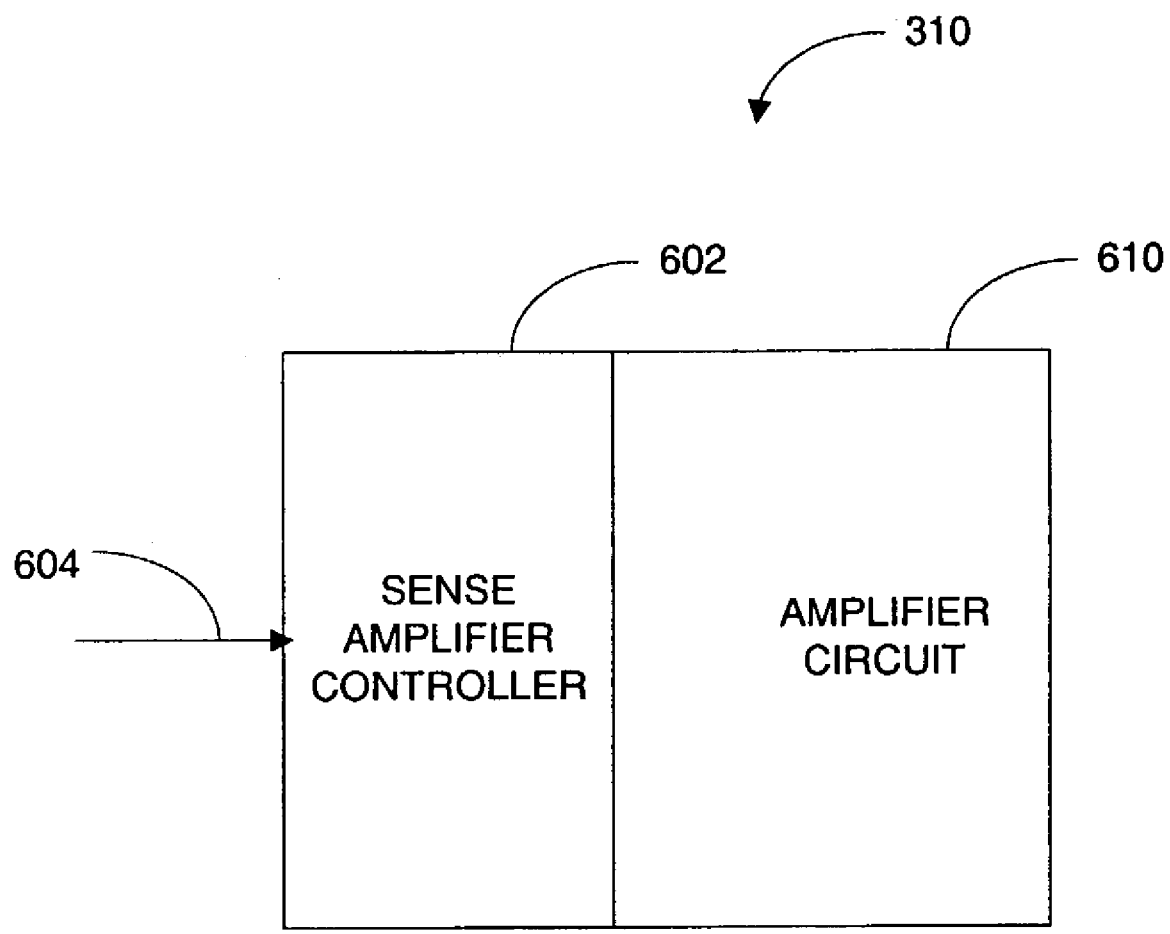
FIG. 6A is a block diagram of a sense amplifier in accordance with one embodiment of the present invention.

FIG. 6A is a block diagram of a sense amplifier 310 in accordance with one embodiment of the present invention. The sense amplifier 310 can include a sense amplifier controller 602 and an amplifier circuit 610. The sense amplifier controller 602 includes a control input 604. The control input 604 can be connected to the process monitor 320. The process monitor 320 can output a process-type correction signal to the sense amplifier controller 602. The sense amplifier controller 602 can adjust the operation of the amplifier circuit 610 according to the process-type correction signal. The sense amplifier controller 602 can adjust the operation of the amplifier circuit 610 by adjusting the amplification parameters of the amplifier circuit 610.

Figure 6B:
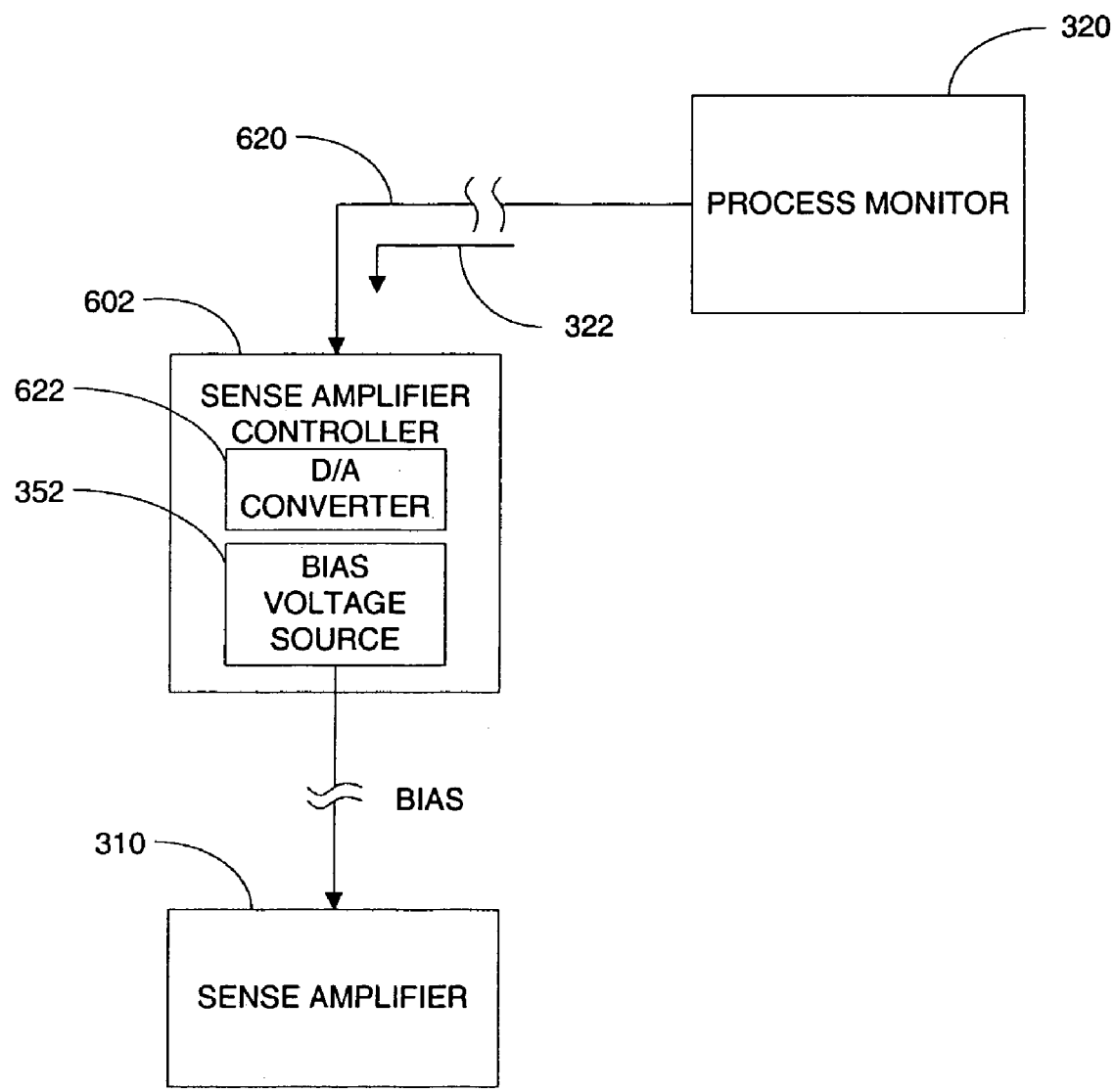
FIG. 6B is a block diagram of the interconnections between the process monitor, the sense amplifier controller, a bias voltage source and the sense amplifier according to one embodiment of the present invention.
Figure 7:
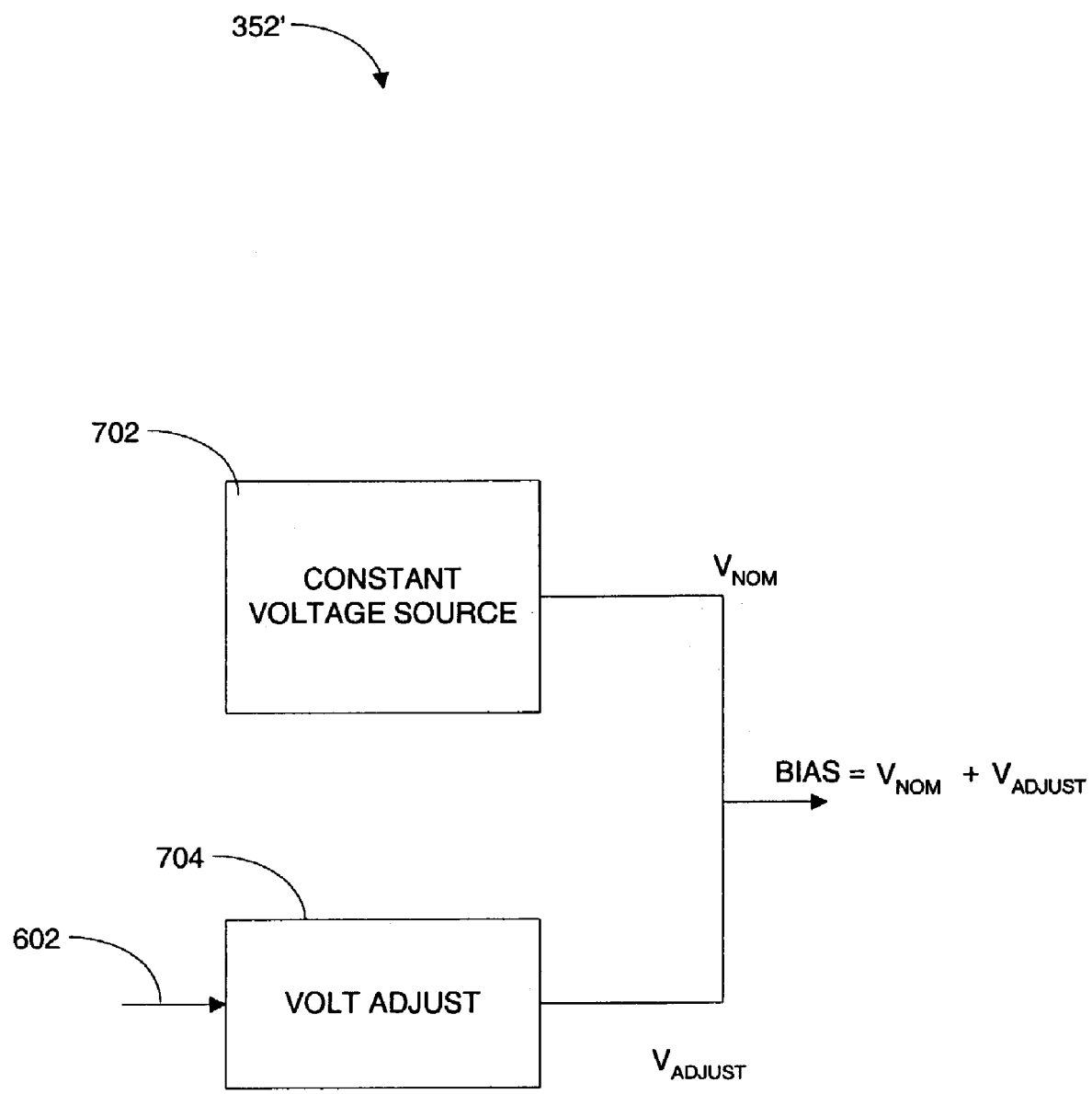
FIG. 7 is a block diagram of a bias voltage source according to one embodiment of the present invention.

FIGS. 6B and 7 below describe embodiments where the sense amplifier controller 602 includes a bias voltage source 352 so that the sense amplifier controller 602 can adjust the bias voltage applied to the sense amplifier 310 to adjust the operations of the sense amplifier 310, according to the process-type of the sense amplifier 310 (e.g., fast, slow, typical). However, in alternative embodiments, the sense amplifier controller 602 can also adjust a bias current source to adjust the bias current or other amplification parameters to adjust the operations of the sense amplifier 310 according to the process-type of the sense amplifier 310.

FIG. 6B is a block diagram of the interconnections between the process monitor 320, the sense amplifier controller 602, a bias voltage source 352 and the sense amplifier 310 according to one embodiment of the present invention. The process monitor 320 receives the process-type for the sense amplifier 310 as will be described in more detail below. The process monitor 320 outputs a process-type correction signal 322 to the sense amplifier controller 602. The sense amplifier controller 602 adjusts the respective output bias voltage of the bias voltage source 352 in response to the received process-type correction signal.

The sense amplifier controller 602 can be coupled to the process monitor 320 by of a bus 620 or other commonly known methods. The bus 620 between the process monitor 320 and the sense amplifier controller 602 can be a dedicated bus or a shared bus that is shared by the multiple sense amplifier controllers 602 and the corresponding multiple bias voltage sources, and possibly other devices (not shown). Each sense amplifier controller 602 can also include an address such that a particular process-type correction signal 322 can also include an address portion that corresponds with the sense amplifier controller 602. The particular process-type correction signal 322 can therefore be addressed to the corresponding sense amplifier controller 602 and be distributed via the shared bus system 620.

The above described interconnection between the sense amplifier controller 602 and the bias voltage source 352 allows individual adjustment of each of the bias voltage sources 352 according to the process type of the corresponding sense amplifiers that receive bias voltage from the bias voltage source 352.

The bias voltage source 352 outputs an adjusted bias voltage to the sense amplifier 310 in response to the process-type correction signal 322. The sense amplifier controller 602 can use any system or method known in the art to use the process-type correction signal 322 to control the variable, output bias voltage. The process-type correction signal 322 can be a digital or an analog signal.

In one embodiment the sense amplifier controller 602 includes a digital to analog (D/A) converter 622 to convert a digital n-bit process-type correction signal 322. In another example, a D/A converter 622 can convert a digital, n-bit process-type correction signal 322 to an analog bias signal used to produce the variable output bias voltage. Alternatively, the D/A converter 622 can include a look-up table to reference a bias voltage level that is used to produce the desired output bias voltage. By way of example, a process-type correction signal 322 of "10110001" corresponds, in a lookup table, to a voltage of 0.3075 VDC so that the output voltage of the bias voltage source 352 will be adjusted to produce a process corrected current in the constant current source of the corresponding sense amplifier (or amplifiers).

Alternatively, the process-type correction signal 322 could be the actual local process type of the sense amplifier 310 and the process-type correction signal 322 can be correlated to a voltage in a look-up table. Conversely, process monitor 320 can determine the precise process-type correction signal 322 such as by way of a look-up table or according to an algorithm or other methods known in the art. The resulting process-type correction signal 322 can be provided to the D/A converter 622, which directly converts the received process-type correction signal 322 to an analog biasing or adjusting signal for the bias voltage source 352.

The precise values to the look-up tables and process-type correction algorithms described above can be determined by one or more parameters of the IC die 350. In one embodiment the parameters are included or stored on the IC die 350, such as in an EEPROM 370 portion of the IC die 350, or other methods of recording the parameters on or in the IC die 350 or in accompanying integrated circuits or software, that could be read by the process monitor 320.

The parameters of the IC die 350 can include process types in certain portions of the IC die such as may be determined in production testing. The parameters of the IC die 350 can be stored in the EEPROM 370 portion as part of the production cycle. By way of example, when a semiconductor IC 350 is produced, the devices within the IC 350 (e.g., sense amplifiers, I/O buffers, flip-flops, logic gates, etc.) are tested to determine the process-type of the devices. Once the process-type of each of the devices are determined, then the process-types of the devices is stored as device parameters such as being stored on the IC die 350 in a EEPROM 370 or similar location. When the IC die 350 is powered-up for use, the process monitor 320 can read the parameters of the IC die 320 from the EEPROM 370 portion so that appropriate process-type correction techniques can be applied to the various locales of the IC die 350. The above example methods are intended to be examples only and the invention should not be limited to these embodiments.

FIG. 7 is a block diagram of a bias voltage source 352' according to one embodiment of the present invention. A constant voltage source 702 produces a constant nominal voltage out $V_{nom}$. A voltage adjuster 704 is coupled in parallel with the constant voltage source 702. The voltage adjuster 704 receives the process-type correction signal 322 and outputs a $V_{adjust}$ voltage. An output bias voltage is equal to the sum of $V_{adjust}$ and $V_{nom}$. In this embodiment, $V_{nom}$ is a set point voltage about which the process-type correction signal 322 adjusts the output bias voltage. The value of $V_{nom}$ is dependant on the particular semiconductor device and material. By way of example in one semiconductor device, the $V_{nom}$ is equal to about 0.25 VDC and $V_{adjust}$ is equal to about +/−0.075 VDC yielding a range of bias voltage from about 0.175 VDC to about 0.325 VDC.

Rather than adjusting bias voltage above and below a set point voltage, an alternative bias voltage source 352' could be an adjustable voltage source that is independent of a particular set point.

The bias voltage source 352 varies the bias voltage to compensate for the process-type of the sense amplifier(s) 310 that the bias voltage source 352 supplies bias voltage to. The result is the bias voltage for the sense amplifier 310 is adjusted slightly up or down which slightly changes the current "constant current" $I_{BIAS}$ for the sense amplifier 310.

The adjusted $I_{BIAS}$ for the sense amplifier 310 adjusts the slew rate and the gain according to the process-type (e.g., slow, fast, typical) of the sense amplifier 310.

It should be appreciated that there are multiple local sets of bias voltage sources 352 and corresponding sense amplifiers 310 distributed about the IC die 350 and that each local set of a bias voltage source 352 and one or more corresponding sense amplifiers 310 can have a different bias voltage that is optimized for the actual process-type the one or more sense amplifiers 310.

Figure 8:
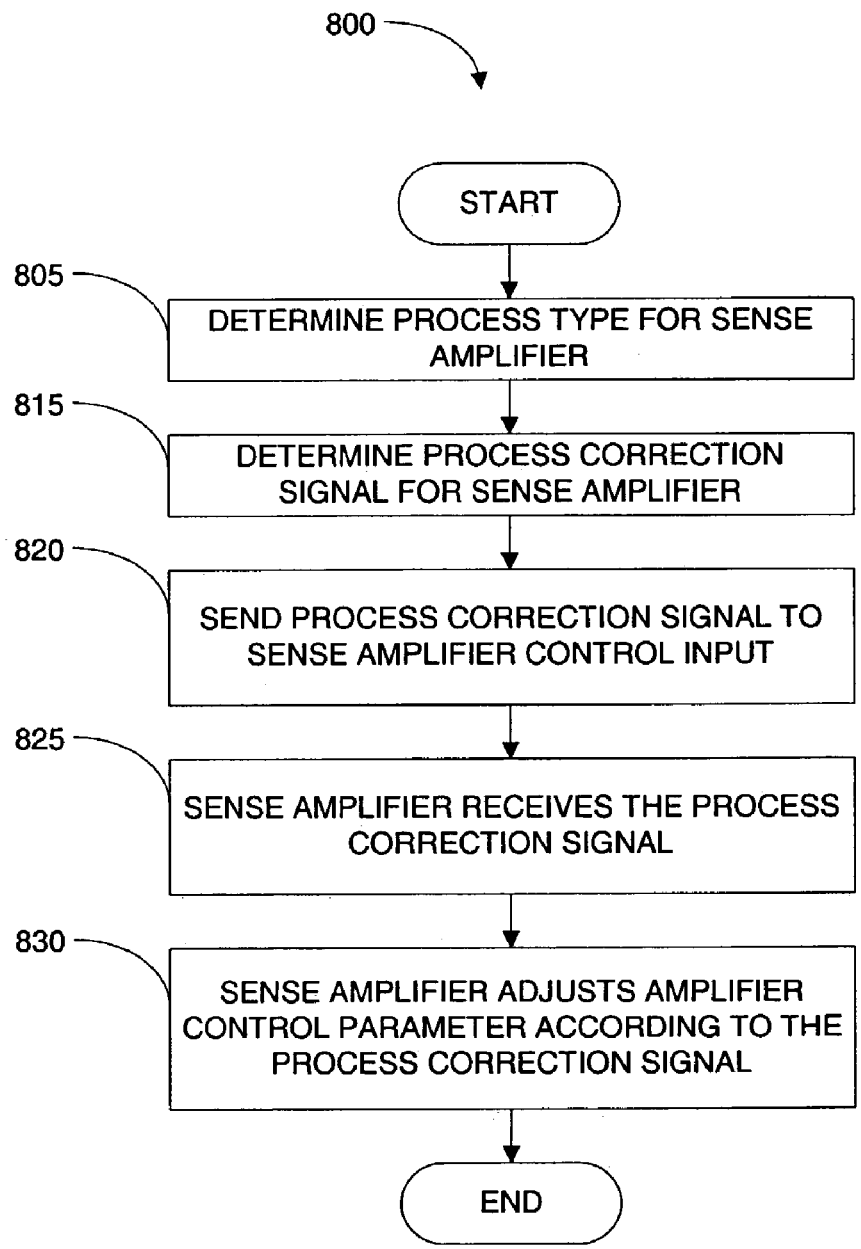
FIG. 8 is a flowchart of the method operations of optimizing the operation of a sense amplifier according to the process type of the sense amplifier in accordance with one embodiment of the present invention.

FIG. 8 is a flowchart of the method operations 800 of optimizing the operation of a sense amplifier according to the process type of the sense amplifier in accordance with one embodiment of the present invention. In operation 805, the process type of the sense amplifier 310 is determined. The process type can be determined in post production testing or can be determined dynamically such as through constant testing of the switching speed of the sense amplifier 310.

The monitor 320 determines a process-type correction signal 322 in operation 815. The process monitor 320 outputs a process-type correction signal 322 to the corresponding sense amplifier controller control input, in operation 820.

In operation 825, the process-type correction signal 322 is received in the corresponding sense amplifier 310. In operation 830, the sense amplifier 310 adjusts operation according to the process-type correction signal 322. In one embodiment, the bias voltage source 352 can receive the process-type correction signal and adjust the bias voltage as described above. The adjusted bias voltage is then output to the corresponding sense amplifier 310 so as to adjust the operation of the sense amplifier 310. Alternatively, the bias current or other amplification control parameters of the sense amplifier 310 could be adjusted according to the process-type correction signal.

A significant benefit of the systems and methods described in FIGS. 3A–8 above is that, not all of the bias voltage sources must produce the same bias voltage but rather each bias voltage source can be individually adjusted to output a precise optimized bias voltage to the corresponding type of sense amplifiers to compensate for the process-type of the sense amplifier. By way of example, the bias voltage applied to the slow-type sense amplifiers can be increased, thereby reducing the switching time of the slow-type sense amplifiers, without increasing the switching time for all components in the IC die 350. Further, the bias voltage applied to a fast-type sense amplifier can be decreased, thereby increasing the switching time of the fast-type sense amplifier, without decreasing the switching time for all components in the IC die 350. In either case of increasing or decreasing the bias voltage of only a selected sense amplifier, the total power consumption and dissipation of the IC 350 is not significantly increased or decreased.

While the disclosed invention is described in terms of bias voltages being used to manipulate the corresponding biased currents, it should be appreciated that in various alternative embodiments of the present invention that include various materials and device types such as a PBIAS or an NBIAS voltage could also be used to manipulate the corresponding biased currents in P-type and N-type devices. Further, describing the invention in terms of bias voltages are merely exemplary embodiments and are not intended to exclude alternative embodiments that include manipulating bias current of the sense amplifier or power supply of the sense amplifier or other amplification control parameters of the sense amplifier 310.

As used herein in connection with the description of the invention, the term "about" means +/−10%. By way of example, the phrase "about 0.500" indicates a range of between 0.450 and 0.550.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in FIGS. 5 and 8 are not required to be performed in the order illustrated, and that all the processing represented by the operations may not be necessary to practice the invention. Further, the processes described in FIGS. 5 and 8 can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of adjusting a sense amplifier comprising:
   determining a process-type of the sense amplifier, wherein the process-type includes one of a slow-type, a typical-type or a fast type;
   providing an amplification control parameter to the sense amplifier; and
   adjusting the amplification control parameter to the sense amplifier according to the process-type of the sense amplifier including determining a process-type correction signal including providing a look-up table that includes at least two process-types of the sense amplifier and a corresponding process-type correction signal for each of the at least two process-types.

2. The method of claim 1, wherein the amplification control parameter includes a bias voltage.

3. The method of claim 2, wherein the bias voltage is provided by an adjustable bias voltage source.

4. The method of claim 3, wherein a process monitor receives the process-type of the sense amplifier and adjusting the amplification control parameter to the sense amplifier according to the process-type of the sense amplifier includes:
   applying the process-type correction signal to the adjustable bias source.

5. The method of claim 4, wherein applying the process-type correction signal to the adjustable bias source includes:
   outputting an n-bit process-type correction signal from a process monitor; and
   receiving the n-bit process-type correction signal in the adjustable bias source.

6. The method of claim 5, wherein adjusting the bias voltage to the sense amplifier according to the process-type of the sense amplifier includes converting the n-bit process-type correction signal in the adjustable bias source to an adjust voltage.

7. The method of claim 6, wherein the adjust voltage is added to a constant voltage to produce an adjusted bias voltage.

8. The method of claim 5, wherein the n-bit process-type correction signal includes an I/O buffer control signal.

9. The method of claim 1, wherein process-type is a description of a switching speed of the sense amplifier.

10. A circuit comprising:
    an integrated circuit including a plurality of sense amplifiers that are distributed about the integrated circuit, each one of the sense amplifiers including a control input; and
    a process monitor capable of determining a plurality of corresponding process-types that correspond to each of the plurality of sense amplifiers and having an output coupled to the control input of the corresponding sense amplifiers, wherein the process monitor includes:
       a processor having a control output signal that is coupled to the control input of each of the corresponding sense amplifiers; and
       a processor-readable storage medium having the plurality of process-types stored therein.

11. The circuit of claim 10, wherein the processor portion of the process monitor is external to the integrated circuit.

12. The circuit of claim 10, wherein the process monitor is capable of outputting a digital control input signal to the control input of each of the least one corresponding sense amplifiers.

13. The circuit of claim 12, wherein each one of the plurality of sense amplifiers includes:
    an adjustable bias source that has an output coupled to the corresponding bias input of the sense amplifier, each of the corresponding, adjustable bias sources having a bias control input coupled to the sense amplifier control input.

14. The circuit of claim 10, wherein the processor portion of the process monitor is included in the integrated circuit.

15. The circuit of claim 13, wherein each of the corresponding, adjustable bias sources includes:
    a constant voltage circuit; and
    a voltage adjuster, an output of the constant voltage circuit and an output of the voltage adjuster being coupled to the adjustable bias source output.

16. A circuit comprising:
an integrated circuit including a plurality of sense amplifiers that are distributed about the integrated circuit, each one of the sense amplifiers including a control input;
a process monitor capable of determining a plurality of corresponding process-types that correspond to each of the plurality of sense amplifiers and having an output coupled to the control input of the corresponding sense amplifiers, wherein the process monitor is capable of outputting a digital control input signal to the control input of each of the least one corresponding sense amplifiers, wherein each one of the plurality of sense amplifiers includes an adjustable bias source that has an output coupled to the corresponding bias input of the sense amplifier, each of the corresponding, adjustable bias sources having a bias control input coupled to the sense amplifier control input; and
wherein each of the corresponding, adjustable bias sources includes:
a constant voltage circuit; and
a voltage adjuster, an output of the constant voltage circuit and an output of the voltage adjuster being coupled to the adjustable bias source output; and
wherein the constant voltage circuit includes a voltage divider.

17. A circuit comprising:
an integrated circuit including a plurality of sense amplifiers that are distributed about the integrated circuit, each one of the sense amplifiers including a control input;
a process monitor capable of determining a plurality of corresponding process-types that correspond to each of the plurality of sense amplifiers and having an output coupled to the control input of the corresponding sense amplifiers, wherein the process monitor is capable of outputting a digital control input signal to the control input of each of the least one corresponding sense amplifiers, wherein each one of the plurality of sense amplifiers includes an adjustable bias source that has an output coupled to the corresponding bias input of the sense amplifier, each of the corresponding, adjustable bias sources having a bias control input coupled to the sense amplifier control input; and
wherein each of the corresponding, adjustable bias sources includes:
a constant voltage circuit; and
a voltage adjuster, an output of the constant voltage circuit and an output of the voltage adjuster being coupled to the adjustable bias source output; and
wherein the voltage adjuster includes a digital to analog converter.

18. The circuit of claim 15, wherein the voltage adjuster is capable of receiving a digital process-type control signal from the process monitor and outputting an adjusting voltage.

19. The circuit of claim 18, wherein an adjustable bias source output voltage equals a sum of the output voltage of the constant voltage circuit and the adjusting voltage.

20. A microprocessor comprising:
a plurality of sense amplifiers that are distributed about the microprocessor, each one of the sense amplifiers including a corresponding, adjustable bias source that has an output coupled to the corresponding bias input of the sense amplifier, each of the corresponding, adjustable bias sources having a control input; and
a process monitor capable of determining a plurality of corresponding process-types that correspond to each of the plurality of sense amplifiers and having an output coupled to the control input of the corresponding sense amplifiers, wherein the process monitor includes:
a processor having a control output signal that is coupled to the control input of each of the corresponding sense amplifiers; and
a processor readable storage medium having the plurality of process-types stored therein.

* * * * *